United States Patent [19]

Lewallen

[11] Patent Number: 5,122,734
[45] Date of Patent: Jun. 16, 1992

[54] METHOD AND APPARATUS FOR PRESCALER DESYNCHRONIZATION

[75] Inventor: Roy W. Lewallen, Beaverton, Oreg.

[73] Assignee: Tektronix, Inc., Beaverton, Oreg.

[21] Appl. No.: 555,212

[22] Filed: Jul. 19, 1990

[51] Int. Cl.⁵ .................... G01R 13/20; H03K 17/00
[52] U.S. Cl. ................ 324/121 R; 307/240; 364/487
[58] Field of Search ............ 324/121 R, 77 A; 328/151; 364/574, 487; 370/102, 119; 375/106, 121; 307/240; 377/130

[56] References Cited

U.S. PATENT DOCUMENTS

| | | | |
|---|---|---|---|
| 3,456,189 | 7/1969 | Hornak | 324/121 R |
| 3,473,123 | 10/1969 | Hornak | 324/121 R |
| 3,713,029 | 1/1973 | Uchida | 328/151 |
| 4,142,146 | 2/1979 | Schumann et al. | 324/121 R |
| 4,495,586 | 1/1985 | Andrews | 364/487 |
| 4,621,217 | 11/1986 | Saxe et al. | 324/121 R |
| 4,890,248 | 12/1989 | Reinhardt | 364/574 |

*Primary Examiner*—Ernest F. Karlsen
*Attorney, Agent, or Firm*—Boulden G. Griffith; Francis I. Gray

[57] ABSTRACT

A method and apparatus prevents unwanted synchronization from obstructing a data acquisition instrument operator's view of N multiplexed signals synchronized to a high speed system clock being used to trigger an instrument through a prescaler with a fixed prescaling factor M, where N and M are related by a common factor. During a time while the instrument, for example, an oscilloscope, is ignoring trigger input information, a desynchronizing signal is applied to the prescaler, causing it to miss a random number of counts or causing it to count incorrectly. Thus, when the oscilloscope resumes triggering it is likely to be synchronized to a different combination of the multiplexed signals. This technique can be applied to individual data points or to records containing a number of data points. By accumulating a number of records obtained in this way and superimposing them on the display, or by simply displaying them very rapidly so that the averaging effects of the human eye cause them to appear to be superimposed, these composite records effectively include complete information about the full set of multiplexed signals.

34 Claims, 3 Drawing Sheets

METHOD AND APPARATUS FOR PRESCALER DESYNCHRONIZATION

BACKGROUND OF THE INVENTION

This invention relates to the field of data acquisition instrument triggering, and more particularly to the field of prescaling of oscilloscope trigger sources so that higher frequency trigger sources can be used.

The trigger circuits of all data acquisition instruments, including oscilloscopes, have some bandwidth limitation. When the desired trigger source has a frequency that is beyond this bandwidth, prescalers have sometimes been used to reduce this frequency by dividing the trigger pulses by some modulus M. A prescaler is a fast counter with a modulus that is usually small. M input pulses produce one output pulse. Some prescalers permit M to be a variable number, controllable through an auxiliary set of inputs. However, at higher frequencies, currently about 5 GHz, only fixed modulus prescalers are commercially available.

While fixed modulus prescalers are suitable for many data acquisition applications, for some applications the use of a fixed modulus prescaler can create a problem. One such troublesome application can arise in the use of a prescaler in an oscilloscope's triggering circuitry. Prescalers are used at the front end of oscilloscope trigger circuitry to divide a high frequency trigger source down to a frequency within the bandwidth of the rest of the oscilloscope's trigger section. The difficulty can occur when one wishes to use the oscilloscope to view high speed, time-multiplexed signals on a single line, when their occurrence is synchronized to an even higher speed system clock. The oscilloscope operator may wish to view these signals as they are multiplexed together on this single line. Under these circumstances, if the number of sequentially multiplexed signals, N, is related to the fixed prescaler modulus, M, by certain relationships, the oscilloscope will only be triggered while a sub-set of the multiplexed signals are present. This can occur whenever both N and M are divisible by any whole number other than one.

For example, if the number of multiplexed signals is sixteen (N=16) and the fixed prescaling factor is eight (M=8), the oscilloscope will always trigger when only two of the sixteen signals, S0 through S15, are present. For instance, the oscilloscope might only see signals S0 and S8, or only S5 and S13, or only some other pair of the sixteen signals. Which pair will be seen depends on what happened to be present when the high speed system clock was connected to the prescaler. This occurs because the two signals are synchronized to the same source and in an integral relationship with each other, i.e., N and M share a common factor. Since even powers of two are in common use for both M and N, this situation occurs quite frequently. Since the operator of the oscilloscope wishes to view the whole composite waveform, with contributions from all of the signals, this behavior frustrates his intentions.

What is desired is a method and apparatus that will prevent unwanted synchronization from obstructing an instrument operator's view of N multiplexed signals synchronized to a high speed system clock being used to trigger an instrument through a prescaler with a fixed prescaling factor M, where N and M are related by a common factor.

SUMMARY OF THE INVENTION

Accordingly, the present invention comprises a method and apparatus that prevents unwanted synchronization from obstructing an instrument operator's view of N multiplexed signals synchronized to a high speed system clock being used to trigger an instrument through a prescaler with a fixed prescaling factor M, where N and M are related by a common factor.

During a time while the instrument is ignoring trigger input information, a desynchronizing signal is applied to the prescaler, causing it to miss a random number of counts or causing it to count incorrectly. Thus, when the instrument resumes triggering it is likely to be synchronized to a different combination of the multiplexed signals. This technique can be applied to individual data points or to records containing a number of data points. By accumulating a number of records obtained in this way and superimposing them on the display, or by simply displaying them very rapidly so that the averaging effects of the human eye cause them to appear to be superimposed, these composite records effectively include complete information about the full set of multiplexed signals.

DETAILED DESCRIPTION

Figure 1:
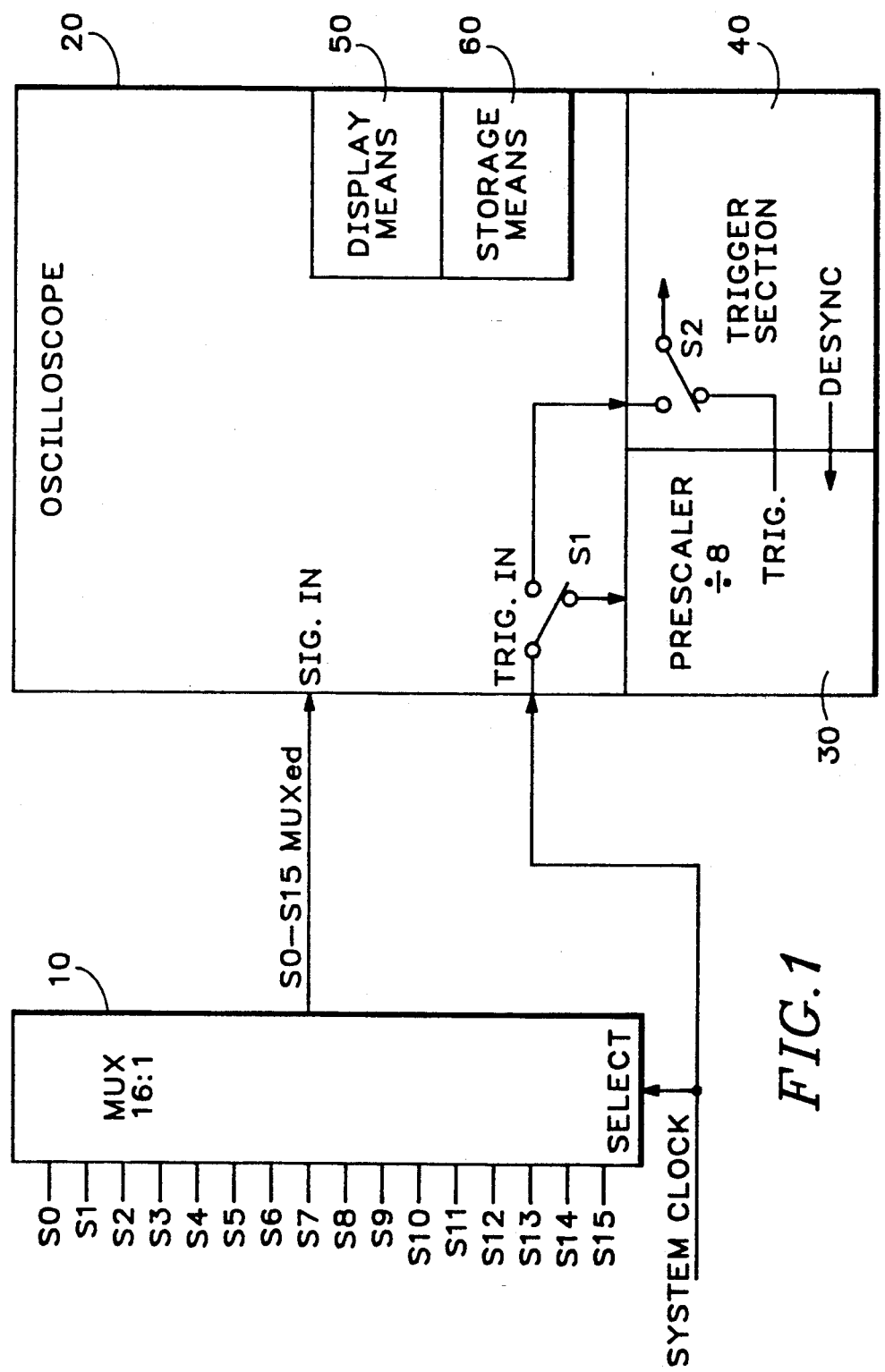
FIG. 1 is a block diagram of an oscilloscope with a prescaler on its trigger input and the output of a multiplexer as its signal input.

Referring now to FIG. 1, 16 different signals are being multiplexed into a single signal by 16:1 multiplexer 10, whose output is being viewed by an oscilloscope 20 at the oscilloscopes SIG IN input. A high speed SYSTEM CLOCK signal is connected to the SELECT input of the multiplexer 10.

The SYSTEM CLOCK signal is also applied to the TRIG IN input of the oscilloscope, and when switch S1 is in the position shown, this trigger input is coupled to divide-by-8 prescaler 30. The output of the prescaler 30 is supplied to the trigger section of the oscilloscope where it is selected as the trigger source by S2.

The FMM110HG, GaAs (Galium Arsenide) Microwave Frequency Divider, is a commercially available fixed modulus (divide-by-8) prescaler 30 manufactured by the Fujitsu Corporation that operates from 2.0 to 10.0 GHZ. It is somewhat typical of a number of advanced prescalers on the market, in that it has a fixed modulus and does not have a RESET input. It accepts a differential input, but also can be driven by a single input to the IN terminal. The /IN terminal is internally biased to a positive voltage source.

Figure 2:
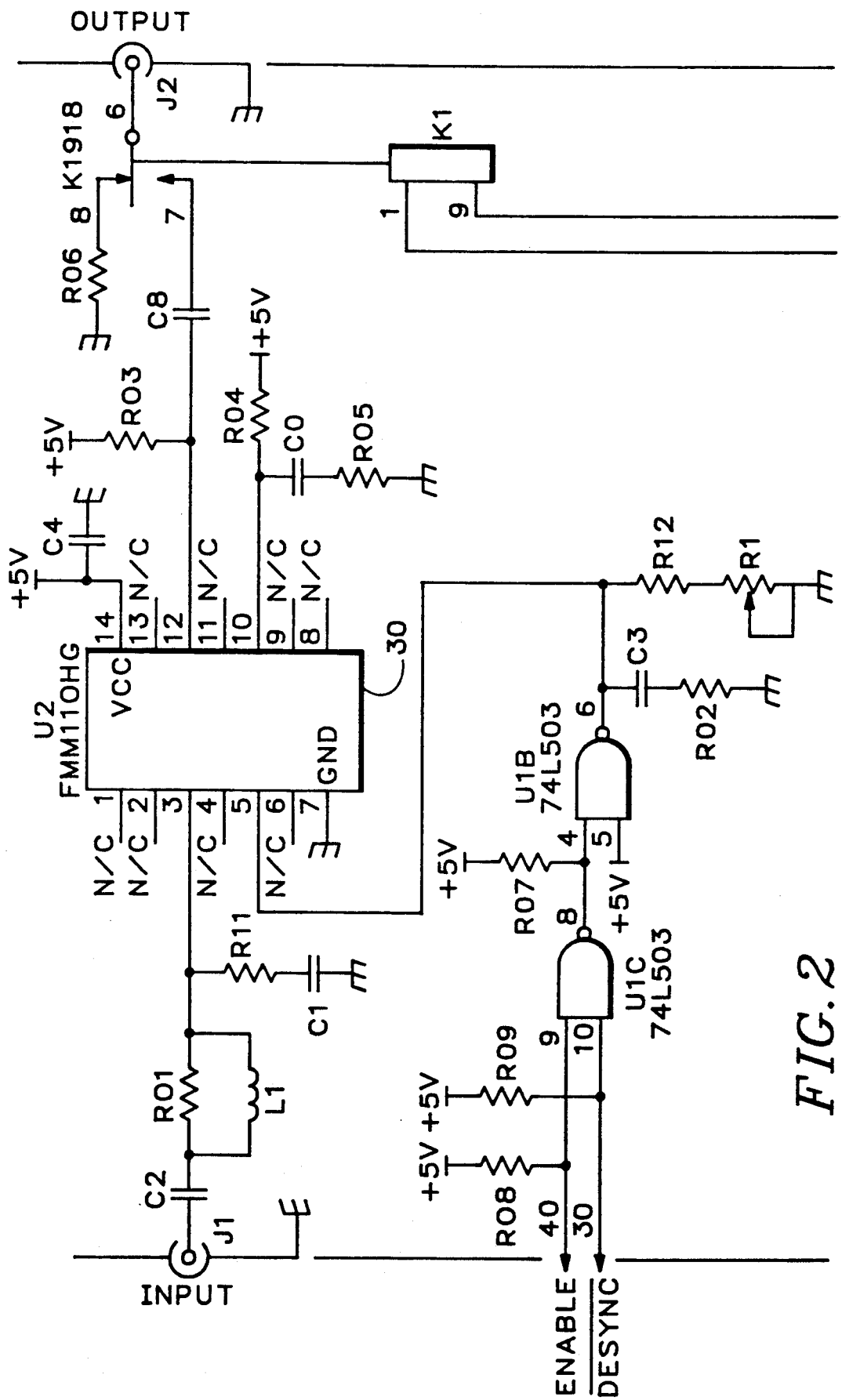
FIG. 2 is a schematic diagram showing one way in which a desync signal can be used to desynchronize the prescaler.

FIG. 2 is a schematic diagram of the circuitry used in implementing one approach to desynchronizing a prescaler 30 according to the present invention. U2 is the prescaler 30, the FMM110HG GaAs Microwave Frequency Divider chip from Fujitsu discussed above. The INPUT signal at J1 corresponds to the high speed SYSTEM CLOCK of FIG. 1. The /DESYNC signal is active low. When the /DESYNC signal is high, meaning that it is not asserted, and ENABLE is also high, the output of NAND gate U1C is low, and U1B's output on pin 6 is an (open-collector) high. The open-collector on U1B-6 leaves pin 5 of U2 biased high internally and causes the prescaler 30 to count normally according the INPUT (SYSTEM CLOCK) signal. Each eight INPUT pulses to U2-3 produce one output pulse on U2-12, which will then appear at the OUTPUT if K1918 is in the 7 position, as it will be if PRESCALE has been selected by the operator.

R02 is a high frequency termination for the prescaler 30, while C3 blocks dc to prevent R02 from disturbing the dc bias. R12 and R1 create a slight dc offset between the prescaler 30 differential inputs U2-3 and U2-5, and thereby prevent oscillations as may occur when no input signal is present. For reasons apart from the desync function, the prescaler 30 IC U2 may otherwise tend to oscillate, producing spurious "triggered" indications, if the prescale input is selected but no INPUT signal is present.

When /DESYNC is asserted and goes low, the output of NAND gate U1C goes high, the output of NAND gate U1B goes low, and that low felt on U2-5 of the prescaler 30 disrupts the counting of the prescaler, either stopping it entirely, or, in the presence of large input signals of particular frequencies on the other input U2-3, at least causing it to count incorrectly. Either effect has the consequence of desynchronizing the relationship between M and N, allowing the object of the present invention to be attained.

The DESYNC signal is suitably derived from a signal whose normal function in the oscilloscope is to load a holdoff register in the timebase during initialization, a setup period prior to each acquisition cycle. This signal goes active for about 250 ns approximately 0.5 ms prior to the beginning of each acquisition cycle. Many other similar pulses already present in the oscilloscope could have been used to accomplish the same effect. This one was chosen because it was physically convenient and because it lasted long enough to be guaranteed of being random with respect to the high speed INPUT signal, and further because it occurred early enough in the initialization cycle to allow the prescaler to have the 0.5 ms mentioned above to be sure that it was ready for normal counting by the time trigger inputs were next accepted.

The desync function can be applied more often, so that individual data points are desynchronized rather than whole records. But, since there may be some doubt as to how well a particular prescaler will work with much shorter recovery times, and because this solution adequately provided the desired result, desynchronization by records rather than by individual triggers was deemed to be a prudent choice.

Figure 3:
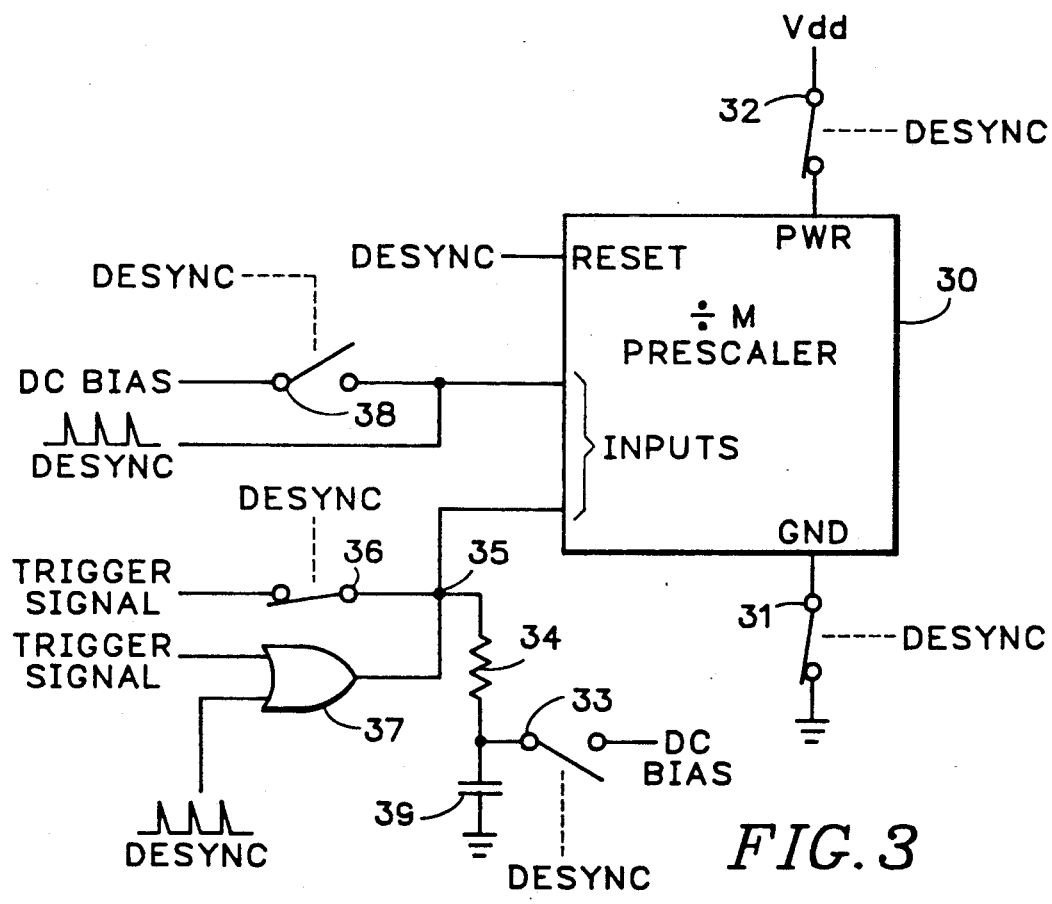
FIG. 3 is a composite of alternative approaches to desynchronizing a prescaler.

The DESYNC signal must be random or pseudorandom with respect to the trigger signal, but how it is used may be varied widely. Referring to FIG. 3, a variety of alternative approaches to desynchronizing the prescaler are shown applied to one generic divide-by-M prescaler 30. (FIG. 3 is intended to show alternatives only, it is not intended that multiple DESYNC signals be applied to one prescaler, as an overly literal interpretation of FIG. 3 would suggest.) For any prescaler 30 with a differential input, any use of the DESYNC signal that temporarily unbalances the biases on the two inputs will work. Connecting one of the inputs to a bias voltage that is sufficiently different from its normal value, as with switches 33 or 38, can be used to accomplish this. The switches shown can be implemented in any appropriate way, for example, transistors, logic gates, or electronic analog switches. For prescalers 30 having a RESET input, the DESYNC signal can be applied thereto in order to achieve the desired effect. The DESYNC signal can also be used to temporarily remove power or ground from the prescaler 30, as shown by switches 32 or 31, respectively, although these approaches could create other problems. The DESYNC signal can also by used to interrupt the incoming trigger signals, as shown with switch 38. Or, the DESYNC signal can be used to add extra trigger signals, as shown applied through OR gate 37. Anything that will cause a miscount will suffice.

The desynchronized data points or records obtained as described above can be displayed as they are acquired, which is very rapidly relative to the speed of the human eye, and will appear to be superimposed to the oscilloscope operator. These data points or records can also be stored and actually superimposed in the display. The oscilloscope 20 shown in FIG. 1 includes display means 50 and storage means 60 to permit these options.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. A method for preventing unwanted synchronization between an input signal and a trigger source in an instrument having a prescaler in a trigger input path, the method comprising the steps of:
   ascertaining an interval during which the instrument is ignoring trigger input information; and
   applying a desynchronization signal to the prescaler during the interval.

2. A method as recited in claim 1 wherein the applying step comprises the step of changing a dc level on one side of a differential input.

3. A method as recited in claim 2 wherein the changing step comprises the step of turning a transistor off or on.

4. A method as recited in claim 2 wherein the changing step comprises the step of opening or closing an electronic switch.

5. A method as recited in claim 2 wherein the changing step comprises the step of altering the output of a gate.

6. A method as recited in claim 1 wherein the applying step comprises the step of removing power from the prescaler.

7. A method as recited in claim 1 wherein the applying step comprises the step of interrupting an input to the prescaler.

8. A method as recited in claim 7 wherein the interrupting step comprises the step of opening an electronic switch.

9. A method as recited in claim 7 wherein the interrupting step comprises the step of altering the output of a gate.

10. A method as recited in claim 1 wherein the applying step comprises the step of adding pulses to an input of the prescaler.

11. A method as recited in claim 1 wherein the applying step comprises the step of removing ground from the prescaler.

12. A method as recited in claim 1 further comprising the step of repeating the steps of ascertaining and applying a number of times to obtain data that is desynchronized.

13. A method as recited in claim 12 further comprising the step of displaying the desynchronized data.

14. A method as recited in claim 12 wherein the desynchronized data comprises records.

15. A method as recited in claim 14 further comprising the step of effectively superimposing the desynchronized data records.

16. A method as recited in claim 15 wherein the effectively superimposing step comprises the step of rapidly displaying so that a human eye causes subjective superimposition.

17. A method as recited in claim 15 wherein the effectively superimposing step comprises the step of simultaneously displaying.

18. An apparatus for preventing unwanted synchronization between an input signal and a trigger source in an instrument having a prescaler in a trigger input path, the apparatus comprising:

means for ascertaining an interval during which the instrument is ignoring trigger input information; and means for applying a desynchronization signal to the prescaler during the interval.

19. An apparatus as recited in claim 18 wherein the means for applying comprises the step of changing a dc level on one side of a differential input.

20. An apparatus as recited in claim 19 wherein the means for changing comprises means for turning a transistor off or on.

21. An apparatus as recited in claim 19 wherein the means for changing comprises means for opening or closing an electronic switch.

22. An apparatus as recited in claim 19 wherein the means for changing comprises means for altering the output of a gate.

23. An apparatus as recited in claim 18 wherein the means for applying comprises means for removing power from the prescaler.

24. An apparatus as recited in claim 18 wherein the means for applying comprises means for interrupting an input to the prescaler.

25. An apparatus as recited in claim 24 wherein the means for interrupting comprises means for opening an electronic switch.

26. An apparatus as recited in claim 24 wherein the means for interrupting comprises means for altering the output of a gate.

27. An apparatus as recited in claim 18 wherein the means for applying comprises means for adding pulses to an input of the prescaler.

28. An apparatus as recited in claim 18 wherein the means for applying comprises means for removing ground from the prescaler.

29. An apparatus as recited in claim 18 further comprising means for accumulating data that is desynchronized.

30. An apparatus as recited in claim 29 further comprising means for displaying the desynchronized data.

31. An apparatus as recited in claim 29 wherein the desynchronized data comprises records.

32. An apparatus as recited in claim 31 further comprising means for effectively superimposing the desynchronized data records.

33. An apparatus as recited in claim 32 wherein the means for effectively superimposing comprises means for rapidly displaying so that a human eye causes subjective superimposition.

34. An apparatus as recited in claim 32 wherein the means for effectively superimposing comprises means for simultaneously displaying.

* * * * *